United States Patent [19]
Shirato

[11] Patent Number: 4,542,482
[45] Date of Patent: Sep. 17, 1985

[54] READ ONLY MEMORY

[75] Inventor: Takehide Shirato, Hiratsuka, Japan

[73] Assignee: Fujitsu Limited, Kanagawa, Japan

[21] Appl. No.: 387,558

[22] Filed: Jun. 11, 1982

[30] Foreign Application Priority Data

Jun. 30, 1981 [JP] Japan ................... 56-102872

[51] Int. Cl.⁴ ............................................. G11C 11/30
[52] U.S. Cl. .................................... 365/182; 365/189
[58] Field of Search ....................... 365/182, 189, 230

[56] References Cited

U.S. PATENT DOCUMENTS 4,398,267 8/1983 Furuyama ........................... 365/182
4,445,202 4/1984 Goetze et al. ....................... 365/182

Primary Examiner—Terrell W. Fears
Attorney, Agent, or Firm—Armstrong, Nikaido, Marmelstein & Kubovcik

[57] ABSTRACT

A read only memory has a plurality of memory cells each of which comprises a transistor.

The transistor in each memory cell is either an offset gate transistor or an enhancement transistor.

A pair of transistors in adjacent memory cells are connected to a bit line via a common connection means.

3 Claims, 6 Drawing Figures

READ ONLY MEMORY

BACKGROUND OF THE INVENTION

1. Field of the Invention

The present invention is directed to a mask read only memory (ROM) which permits the entry of storage data designated by a user into the ROM and in particular to a mask ROM having a memory cell which is comprised of a field effect transistor.

2. Description of the Prior Art

Prior art mask ROM's which permit the entry of designated storage data, generally employ a system wherein the storage data designated by the user is entered by the manufacturing step, thereby enabling the manufacturer of the ROM to complete as much of the manufacturing as possible and only then have to enter the storage data in accordance with the particular user requirements. However, in prior art manufacturing processes of this type, the integration density of the memory is relatively low.

FIGS. 1 and 2 illustrate a prior art mask ROM in which the storage data is stored as existence or absence of an electrode contact window.

Referring to FIG. 1, word address signals $A_0 \ldots A_n$ are supplied to an address buffer $AB_1$. The address buffer $AB_1$ changes the levels of the word address signals. A word decoder selects one of the word line drivers $WD_1 \ldots WD_l$ in accordance with the output of the word address buffer $AB_1$. The selected word line driver makes the level of the selected word line $W_1-W_l$ at a high level and the non-selected word lines remain at a low level.

An address buffer $AB_2$ receives bit address signals $B_0 \ldots B_m$ and changes the levels of these signals, and a bit line selector receives the output of the address buffer $AB_2$ and provides an output to the bit lines (read data) designated by the bit address signals $B_0 \ldots B_m$. A signal $\phi$ is used for precharging the bit lines during the standby period.

A memory cell of the mask ROM comprises an enhancement type MOS FET Q1 where the gate electrode is connected to selected word line $W_i$ and an enhancement-type MOS FET Q2 in which the gate electrode is connected to the non-selected word lines. The sources S of FET's Q1 and Q2 are grounded while the drains D are selectively connected to the selected bit lines $B_n$ via the electrode contact window N. The storage data designated by the user is entered into the memory cell in accordance with the existence or non-existence of the electrode contact window N at the drain portion connected to the bit line. On the other hand, the stored data is read by setting the selected word line Wi and the bit line Bi high (H) level while the non-selected word lines and the bit lines remain at low (L) level. The forming or non-forming of contact windows is accomplished by using a mask having a pattern corresponding thereto. The FET Q1 thus becomes conductive allowing a current to flow from the voltage source $V_{DD}$ to the ground, making the potential of the bit line $B_i$ low. In the case where the electrode contact window N is not formed at the drain portion of FET Q1, FET Q1 cannot conduct the current from $V_{DD}$ and the potential of the bit line $B_i$ remains at high level.

Since the drain portions of FET's Q1 and Q2 of the memory cells have independent patterns, the pattern area is $(28\mu \times 9\mu)$, which results in a reduction in the integration density of the ROM pattern.

SUMMARY OF THE INVENTION

It is an object of the present invention to provide a mask ROM in which the integration density is increased as compared to prior art devices.

The present invention is directed to a mask read only memory (ROM), which comprises a plurality of bit lines, a plurality of word lines and a plurality of memory cells connected to the bit lines and word lines. Each memory cell comprises an offset gate FET or an enhancement type FET, with each memory cell being coupled to one of the plurality of bit lines and one of the plurality of word lines. A pair of adjacent FET's have a common drain connected to one of the bit lines.

DETAILED DESCRIPTION OF THE PREFERRED EMBODIMENTS

Figure 1:
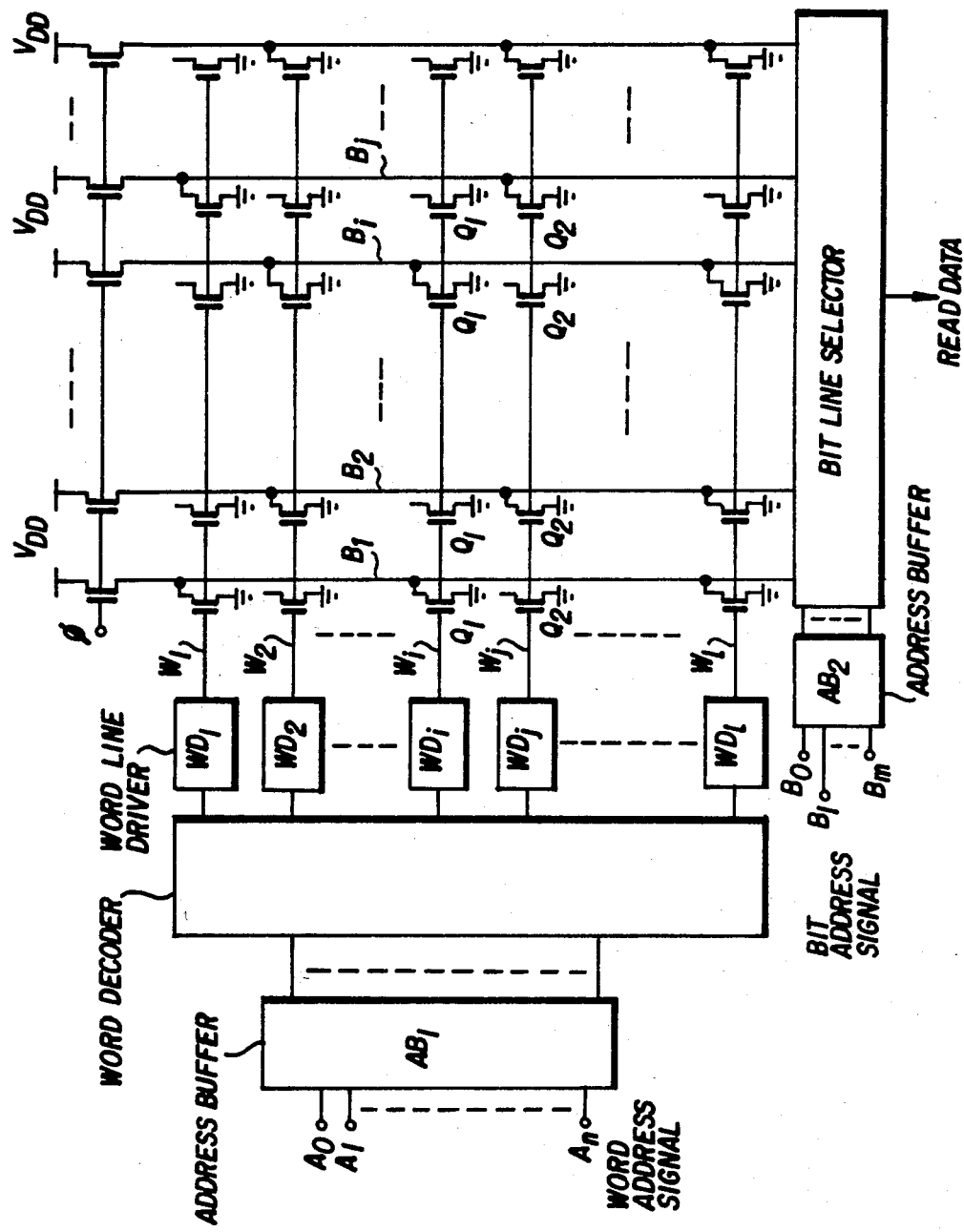
FIG. 1 shows a circuit of a prior art ROM.
Figure 2:
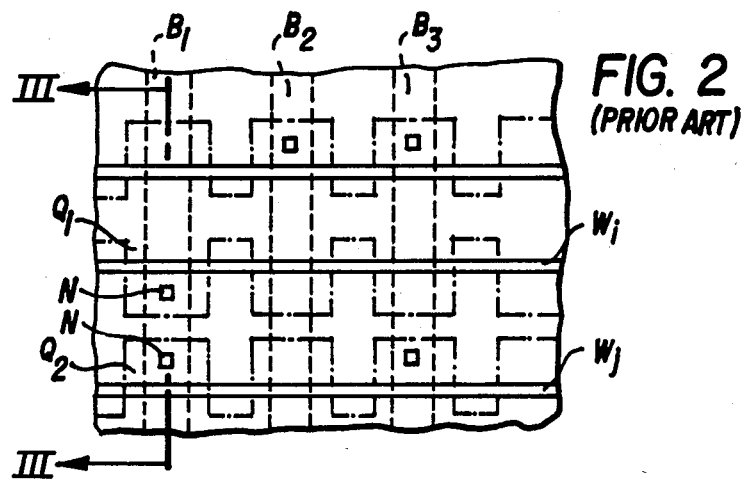
FIG. 2 is a plan view of a portion of the prior art ROM of FIG. 1.
Figure 3:
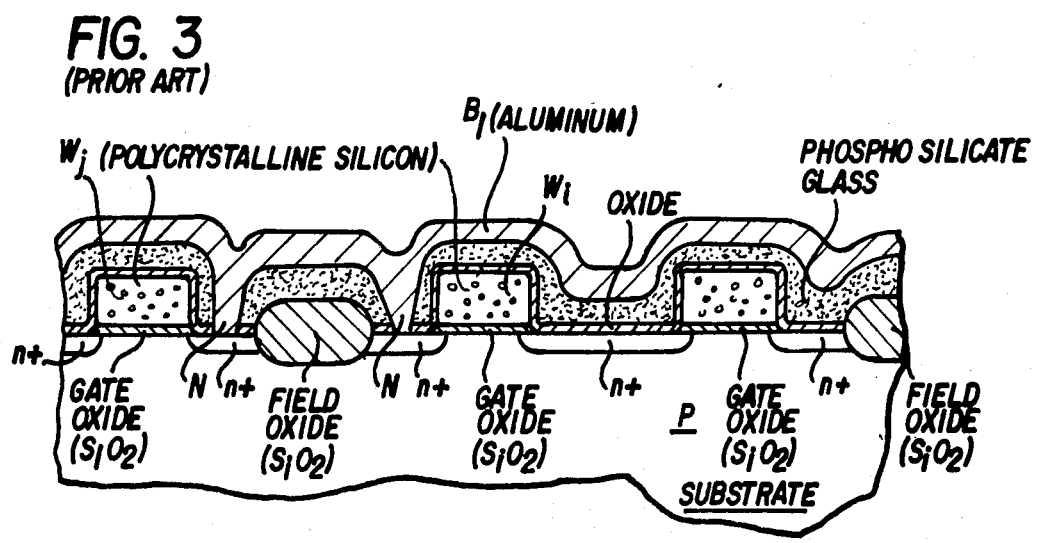
FIG. 3 is a cross-section through section III—III in FIG. 2.
Figure 4:
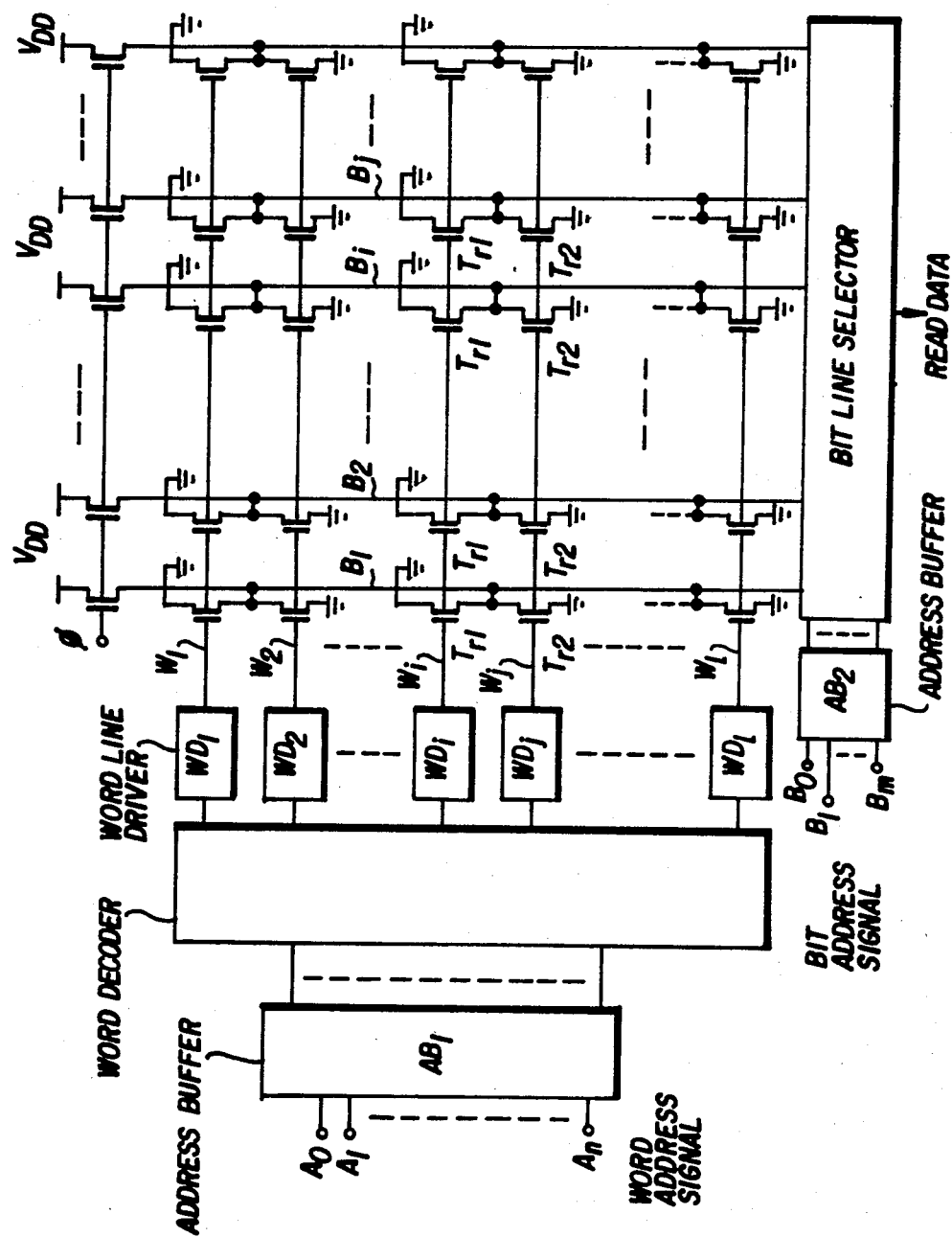
FIG. 4 shows a ROM circuit of the present invention.

Referring to FIG. 4, word address signals $A_0 \ldots A_n$ are supplied to an address buffer $AB_1$. The address buffer $AB_1$ changes the levels of the word address signals. A word decoder selects one of the word line drivers $WD_1 \ldots WD_l$ in accordance with the output of the word address buffer $AB_1$. The selected word line driver makes the level of the selected word line at a high level and the non-selected word lines remain at a low level.

An address buffer $AB_2$ receives bit address signals $B_0 \ldots B_m$ and changes the levels of these signals, and a bit line selector receives the output of the address buffer $AB_2$ and provides an output of the bit lines (read data) designated by the bit address signals $B_0 \ldots B_m$. A signal $\phi$ is used for precharging the bit lines during the standby period.

Figure 5:
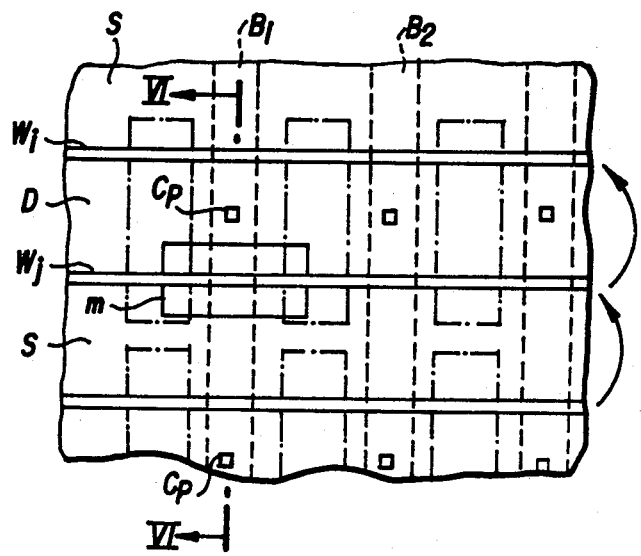
FIG. 5 is a plan of a portion of a ROM of the present invention.
Figure 6:
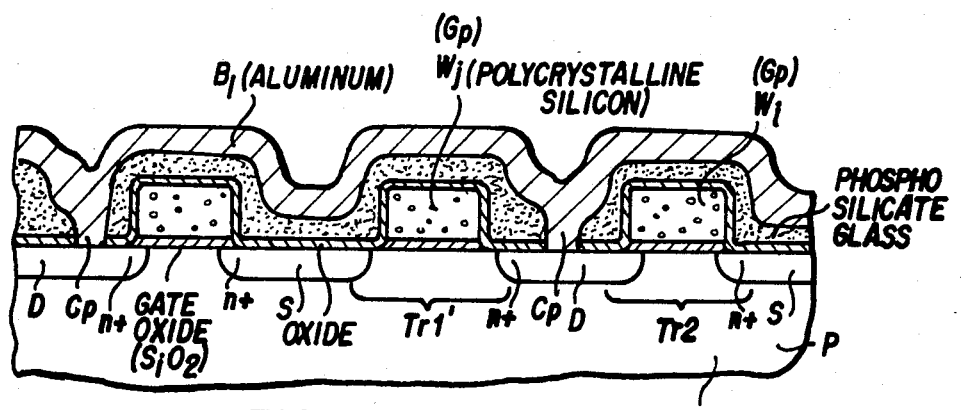
FIG. 6 is a cross-section through section VI—VI in FIG. 5.

In the present invention, as shown in FIGS. 4–6, the mask ROM comprises pairs of MOS FET's Tr1 and Tr2. In the embodiment shown, the gate electrode of one of the FET's Tr1 is connected to a word line $W_i$, while the gate electrode of another FET Tr2 is connected to the word line $W_j$. The source S of each of the FET's is grounded and both FET's Tr1 and Tr2 are formed with a common drain D which is connected to the bit line $B_i$ via the electrode contact window $C_p$ formed at the common drain portion D.

User designated data is stored in the ROM through the processes of manufacturing the ROM. When it is desired to set the data output of a memory cell corresponding to the selected lines $W_i$ and $B_i$ to an H level, FET Tr1 must be formed as an offset gate FET. However, when it is desired to set the data output of the memory cell corresponding to the selected word line $W_i$ and bit $B_i$ to an L level the FET Tr1 must be formed as an enhancement-type FET.

As seen in FIG. 6, the offset gate FET Tr1 has a polycrystalline silicon gate $G_p$ formed on the substrate SUB. The common drain portion D and source S are formed by ion-implantation or diffusion of impurity atoms into the substrate SUB. The offset gate FET can be formed by masking the polycrystalline silicon gate $G_p$ with a mask m, shown in FIG. 5. The mask m is positioned such that the diffusion region of the common drain D and the source S do not reach under the edges of the gate $G_p$.

In the above situation, both the drain D and source S are isolated from the gate $G_p$ at the time of forming the offset gate transistor. However, other structures may also be used. Namely, an offset gate transistor can function when any one of the drain or source is isolated from the gate $G_p$.

When reading data out of the memory cell by setting word line $W_i$ to the H level and setting non-selected word lines to the L level, if the FET Tr1, corresponding to the selected word line $W_i$ and bit line $B_i$, is an offset gate FET as shown in FIG. 6, the FET Tr1 doesn't turn on, and the potential of the bit line $B_i$ remains at the H level.

In the case where FET Tr1 is structured as an enhancement-type FET, which would have a structure corresponding to that of FET Tr2 in FIG. 6, the FET Tr1 becomes conductive when a signal is applied to the gate through selected word line $W_i$ and when it is conductive, the drain is grounded and the potential of the bit line $B_i$ falls down to the L level.

In the present invention, the memory cells comprise FET's which are coupled in pairs with the drains connected in common to the same bit line, the gate electrodes connected to adjacent word lines and the sources grounded. The storage data which is designated by the user, is entered into the ROM by making the FET's either offset gate or enhancement-type FET's, in accordance with a predetermined pattern. The common drain for adjacent transistors requires only a single contact window $C_p$ which substantially improves the integration density of the memory as compared to prior art devices. An an example, the pattern area for forming a two bit NOR gate is $21\mu \times 9\mu$, which is about 75% of the area required in a prior art mask ROM. Thus, the integration density is improved by about 25%.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims rather than the foregoing description, and all changes which come within the meaning and range of equivalency of the claims are, therefore, to be embraced therein.

I claim:

1. A read only memory comprising:
   a plurality of bit lines;
   a plurality of word lines;
   a plurality of FET memory cells each being formed to represent one of two logic states of data, each of said memory cells being coupled individually to one of said word lines and pairs of adjacent memory cells being connected by a common coupling means to one of said bit lines;
   said memory cells that represent one of said logic states of data being formed as an offset gate FET which remains nonconductive when a signal is applied through its respective word line, and said memory cells that represent the other of said logic states of data each being formed as an enhancement FET which becomes conductive when a signal is applied through its respective word line.

2. A read only memory as set forth in claim 1 wherein said common coupling means comprises a common drain.

3. A read only memory as set forth in any one of claims 2 or 1 including a contact window opening onto said common coupling means for permitting contact between said FET and said bit line.

* * * * *